AUTOMATIC FREQUENCY CONTROL SERVO SYSTEM
Filed Aug. 10, 1951 2 Sheets-Sheet 1
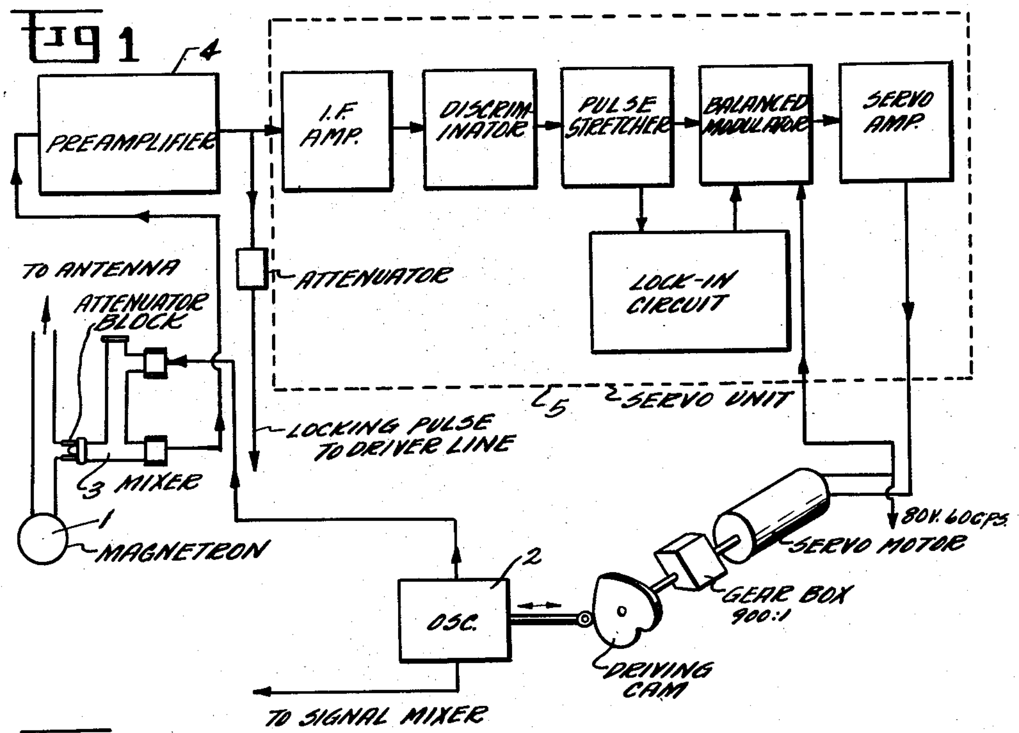
FIG. 1
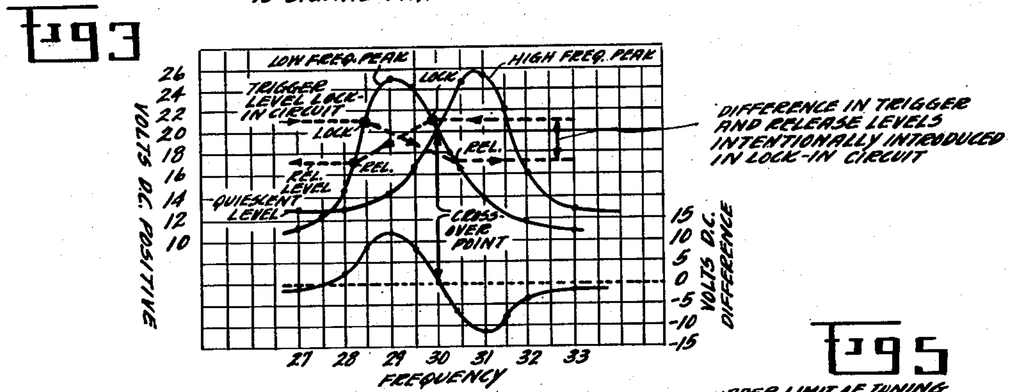
FIG. 3, FIG. 5
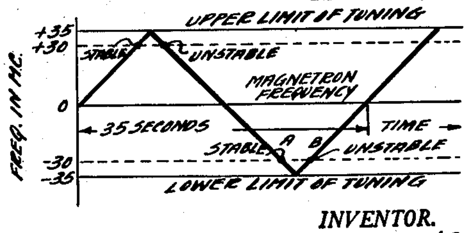
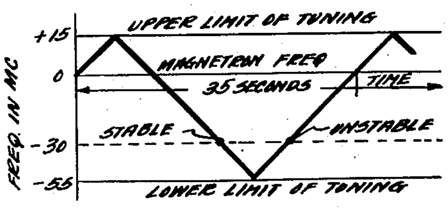
FIG. 4
INVENTOR.
JOHN G. STEPHENSON
BY Theodore C. Wood
AGENT
and
Wade Koontz
ATTORNEY May 11, 1954 J. G. STEPHENSON 2,678,395

AUTOMATIC FREQUENCY CONTROL SERVO SYSTEM

Filed Aug. 10, 1951 2 Sheets-Sheet 2

INVENTOR.
JOHN G. STEPHENSON
BY Theodore C. Wood
AGENT—
and
Wade Koontz
ATTORNEY Patented May 11, 1954 2,678,395

UNITED STATES PATENT OFFICE 2,678,395

AUTOMATIC FREQUENCY CONTROL SERVO SYSTEM

John G. Stephenson, Huntington, N. Y., assignor to the United States of America as represented by the Secretary of the Air Force Application August 10, 1951, Serial No. 241,317

4 Claims. (Cl. 250—36)

This invention relates to frequency control systems and more particularly to automatic frequency control systems of the type wherein a constant frequency difference is maintained between two signals having predetermined frequency values.

One of the main objects of this invention is to provide an automatic frequency control system for an oscillator wherein the oscillator is cyclically adjusted over its entire tuning range until the frequency output of the oscillator has a predetermined difference value with respect to another signal at which point the oscillator tuning mechanism is locked in and will thereafter maintain the predetermined difference value.

In an automatic frequency control system of the type wherein the oscillator is cyclically tuned over a predetermined range and when the output frequency of that oscillator when mixed with another signal is within a predetermined pass band, a lock in circuit is provided which determines whether the condition of cyclical tuning over the predetermined range shall exist, or whether by means of a servo system a predetermined difference frequency between the oscillator and the reference signal is maintained. There will be at least two points on the oscillator tuning adjustment (corresponding to the upper and lower image responses) at which points the predetermined difference frequency exists and the lock-in circuit operates. Only one of these points however will be correct for normal null-seeking operation of the servo system.

It is another important object of this invention to provide a system for automatic frequency control of an oscillator which will distinguish between the correct and incorrect points for null-seeking operation and will lock in only on the correct point.

For a more complete understanding of the invention both as to its apparatus and method of operation reference is had to the following description taken in connection with the drawings wherein:

Figure 1 shows in blocked diagram form an automatic frequency control system of this invention.

Figure 3 are graphs illustrating the frequency response characteristics of the frequency discriminator used in the system of this invention.

Figure 4 is a graph illustrating the difference frequency between the magnetron frequency and the local oscillator frequency when the local oscillator frequency is cyclically adjusting, wherein the adjustment is capable of tuning the oscillator such that only two points of adjustment produces the intermediate frequency.

Figure 5 is a graph illustrating the same characteristics as Figure 4 when the oscillator adjusting means is capable of producing the intermediate frequency at four points of its adjustment.

Figure 2:
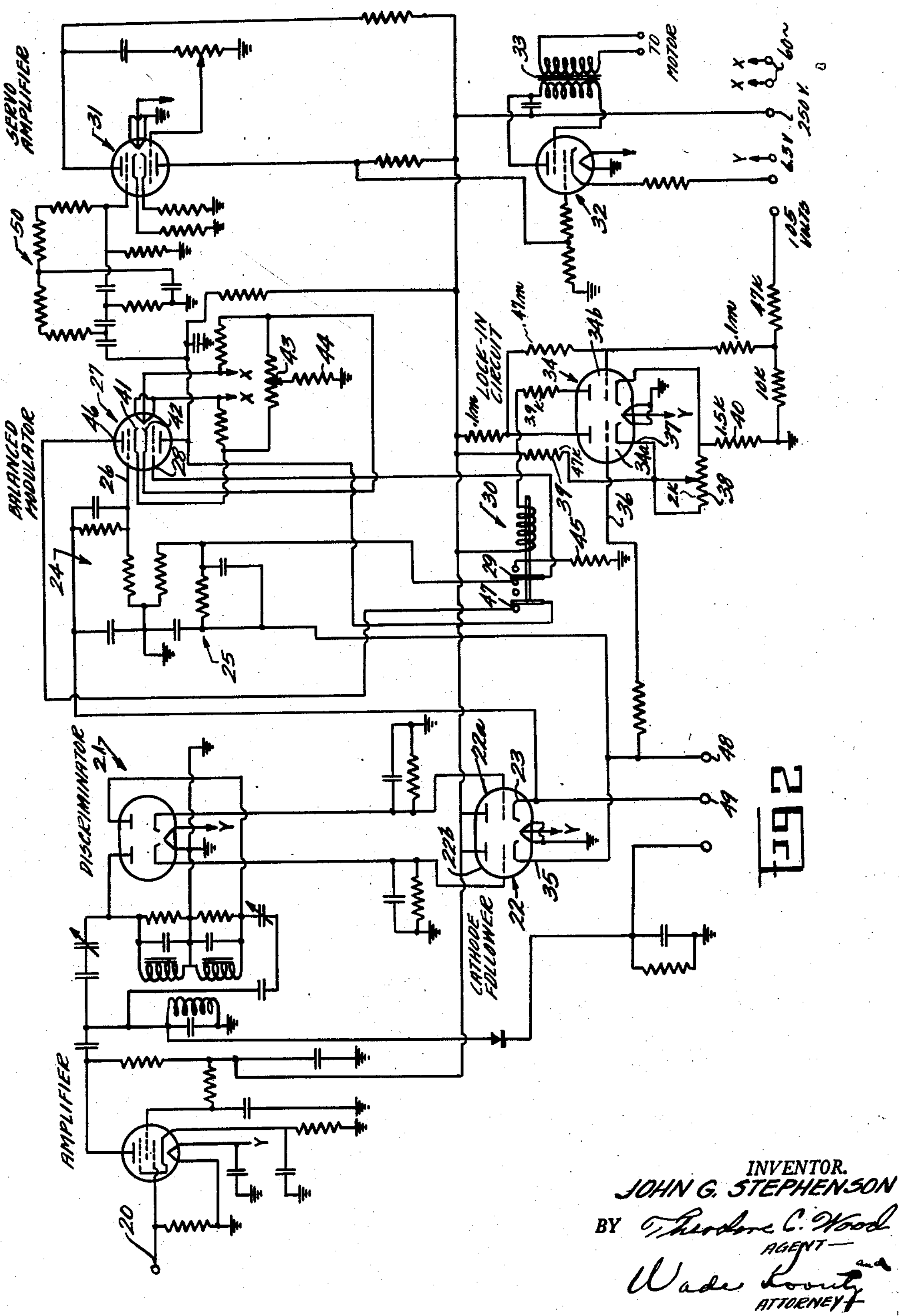
Figure 2 is a schematic diagram of an automatic frequency control system of this invention.

In many types of radar apparatus, it is essential that the local oscillator of the receiver be maintained at a predetermined difference frequency with respect to the frequency of the transmitted signal. Since this invention is particularly well suited for such apparatus, it will be illustrated and described in conjunction with that type of apparatus. It will be understood, however, that the automatic frequency control system of this invention may be incorporated in any apparatus wherein it is desirable to automatically control the frequency of an oscillator.

Referring now to the accompanying drawings and particularly to Figure 1, there is illustrated a first source of oscillation 1 and a second source of oscillation 2. The output of the oscillation sources are mixed in mixer 3 and the sum or difference (I. F.) frequency is produced at the output of the preamplifier 4. The output signal of the preamplifier is fed to the input of servo unit 5. The servo unit essentially comprises an amplifier, the output of which is fed to a frequency discriminator which produces a signal when the frequency is above a predetermined value and a different signal when the frequency is below a predetermined value. The output of the discriminator is then fed to a pulse stretcher whose function is to produce a D. C. signal at its output when a pulse signal appears in its input. The output of the pulse stretcher is fed to each of two circuits, one a balanced modulator and the other a lock-in circuit.

When the output of the pulse stretcher is below a predetermined value (signal at input of servo unit is not within the pass band of the I. F. amplifier) the lock-in circuit unbalances the balanced modulator which will then produce a 60 C. P. S. signal having a predetermined phase relationship to the 60 C. P. S. source. When the output of the pulse stretcher is above a predetermined value (when the signal at the input of the servo unit is within the pass band of I. F. amplifier) the lock-in circuit causes the output of the pulse stretcher to be fed to the balanced modulator which will then produce (1) no signal when the signal at the input of the servo unit has a frequency the same as the center frequency of the discriminator (2) a 60 C. P. S. signal having a predetermined phase relationship to the 60 C. P. S. source when the signal at the input of the servo unit has a frequency above the center frequency of the discriminator and (3) a 60 C. P. S. signal having 180° phase relationship to the (2) signal when the signal at the input of the servo unit has a frequency below the center frequency of the discriminator. The output of the balanced modulator is amplified by the servo amplifier whose output energizes the reversible phase winding of the servomotor whose fixed phase winding is energized from the 60 C. P. S. source. The motor drives a cam through suitable gearing and the cam actuates the frequency adjusting device of the oscillator 2.

In order to more clearly understand this invention the servo unit within the dotted lines of Figure 1 is more fully described in Figure 2.

Referring now to Figure 2 the intermediate frequency signal applied at input 20 is amplified and the amplified signal is fed to a conventional frequency discriminator 21 the output of which is fed to a cathode follower or pulse stretcher comprising a tube 22 the section (*a*) of which has its cathode 23 connected to ground through impedance network 24 and the section (*b*) of the cathode follower has its cathode connected to ground through impedance network 25. The output of the impedance network 24 is fed to control grid 26 of the balanced modulator 27 and the output of the impedance network 25 is connected to grid 28 of balanced modulator 27 through contacts 29 of lock-in relay 30. The output of the balanced modulator 27 is fed to a conventional servo amplifier comprising tubes 31 and 32 whose output is fed to the primary of output transformer 33 whose secondary winding is connected to the reversible phase winding of the servomotor. Included in the servo unit is the lock-in circuit which controls lock-in relay 30, this circuit consists of tube 34 having section (*a*) the grid of which is connected to respond to the output voltage of section (*b*) of the cathode follower and the tube 34 has a section (*b*) having its grid connected to the plate circuit of section (*a*) of the tube 34 in a conventional flip-flop circuit manner having two stable conditions.

*Operation*

With no signal present at the input 20 the voltage at the cathode 35 of the cathode follower 22 is approximately 8 to 13 volts determined by the static characteristics of the cathode follower 22. This voltage is applied to the grid 36 of the lock-in circuit tube 34 section (*a*) but the cathode 37 of that section is set at a D. C. level determined by resistances 38, 39 and 40 such that section (*a*) of tube 34 is cut off. The section (*b*) of tube 34 is therefore conducting and causes about ten milliamps, to flow through the relay coil of relay 30. When the relay 30 is energized it opens its contacts 29 and breaks the circuit to the grid 28 of balanced modulator 27. The cathodes 41 and 42 of the balanced modulator 27 are energized from a 60 C. P. S. source through the voltage divider resistor 43 and 44. When the grid 28 of tube 27 is de-energized by the opening of contacts 29 of relay 30 the balanced modulator becomes completely unbalanced since the grid 28 is then grounded through resistor 45 and the plate 46 of tube 27 is open circuited by contacts 47 of relay 30 and under these conditions the output voltage developed by the balanced modulator 27 is a 60 C. P. S. voltage which is then amplified by the servo amplifier tubes 31, 32 and this 60 C. P. S. voltage appearing across the secondary winding of transformer 33 energizes the servomotor to run in a predetermined direction. When a signal appears at the input 20, and assuming that this signal is 30 megacycles, cathode follower 22 acts as a pulse stretcher, providing the positive direct output voltage at the cathodes that is relatively independent of the duty cycle of the pulse input signal. The voltages at the cathodes 23 and 35 of the cathode follower appear on jacks 48, 29 for test purposes. As will be remembered from the above description, with no signal present the voltage at cathode 35 will be about 8 to 14 volts positive which voltage will also appear at cathode 23 of section (*b*) of the cathode follower and these voltages should be fairly well balanced on the two cathodes. In the presence of a signal at the input 20 the cathode voltage of cathodes 23 and 35 will rise to approximately 20 or 25 volts.

Part of the D. C. voltage at the cathodes of cathode follower 22 is applied to the grids of the balanced modulator 27. The impedance network 24 and 25 in this circuit forms an error-rate circuit to assist in stabilizing the servo.

When the signal appearing at the input 20 has a frequency within the I. F. pass band, for example 30 megacycles, the cathode follower produces about 20 to 25 volts at its cathodes. The grid 36 of lock-in circuit tube 34 under these conditions will be raised to a sufficient level to cause the section (*a*) of that tube to conduct and since this is a flip-flop circuit section (*b*) of that tube will be made non-conducted and relay 30 will be de-energized thus closing its contacts 47 and 29.

Since the discriminator 21 for this example is adjusted to 30 megacycles, and the input 20 is assumed to have a signal of 30 megacycles, the cathodes 23 and 35 of the cathode follower 22 will develop equal voltages and since these voltages are impressed on grids 26 and 28 of balanced modulator 27, both sections of the balanced modulator will conduct an equal amount. The 60 C. P. S. signal impressed on the cathodes of those two sections will produce an output having two signals of equal amplitude and opposite phase and therefore only the 120 C. P. S. component appears in the output of the modulator and is filtered out by the parallel T filter network 50. This 120 C. P. S. component would produce no net torque of the servomotor but would result in undesirable vibrations and unnecessary heating of the motor windings in the null position of the servo system if it were not filtered out. If the input signal at input 20 is slightly above or slightly below the 30 megacycle setting of the discriminator 21, that is the signal is within the predetermined range of the frequency discriminator but the signal is not exactly 30 megacycles, the voltage at cathode 23 will be higher or lower than the voltage on cathode 35 of cathode follower 22 and thus cause the balanced modulator 27 to produce a 60 C. P. S. output having a phase relationship of 90° leading or 90° lagging to the 60 C. P. S. signal applied to the continuously energized winding of the servomotor.

*Transition between searching and null-seeking conditions*

As previously stated the lock-in circuit 34 is triggered by a voltage on grid 36, which is fed from one side of the pulse stretcher or cathode follower 22. This connection effectively provides triggering by only one-half of the discriminator characteristics, which is done purposely to distinguish between stable and unstable operating points.

Figure 3 illustrates the typical discriminator characteristics as measured at the test jacks 48 and 49, and also the effective over all discriminator curve. The threshold adjustment 38 enables the triggering level of the lock-in circuit to be varied; for proper operation it is set approximately as shown in Figure 3. It will be noted that the triggering signal for the lock-in circuit is obtained from the low frequency peak of the discriminator. There is an intentional hysteretic effect in the triggering characteristics of the lock-in circuit, shown by the dash lines in Figure 3, this enables control to be retained by the A. F. C. circuit at stable points for frequency deviations on both sides of the 30 megacycle cross over points. It will be seen that although the triggering level is set at a level such as 21 volts, which is higher than the voltage produced by the low frequency side of the discriminator at the 30 megacycle point, the lock-in circuit will be held in at the 30 megacycle point since the release point of the lock-in circuit is set at 17 volts.

The hysteretic effect is obtained by proper selection of the cathode bias on the (*a*) section of lock-in circuit 34. The cathode bias on section (*a*) when that section is not conducting is the result of the current flowing through resistors 39, 38 and 40 as well as the current flowing through the tube section (*b*) and the resistor 40. The cathode bias on section (*a*) when that section is conducting is a result of the current flowing through resistors 39, 38 and 40 as well as the current flowing through tube section (*a*) and resistors 38 and 40. The particular values for the circuit elements of the lock-in circuit and the tube characteristics of tube 34 are so chosen that when section (*b*) of that tube is conducting a larger signal on the grid 36 is required to make the tube section (*a*) conduct than is required to make the tube section (*a*) cut off once it is conducting.

Referring now to Figure 4 and Figure 5:

Figure 4 shows the frequency adjustment of the oscillator 2 relative to the magnetron frequency when the oscillator 2 frequency adjustment is such that only two points on the tuning adjustment produces a difference of 30 megacycles between the magnetron frequency and the oscillator 2 frequency.

Figure 5 shows the same type of curve wherein the oscillator 2 adjustment is such that four points on the tuning adjustment produces a 30 megacycles difference frequency between the magnetron frequency and the oscillator 2 frequency.

For the purposes of this invention it is immaterial whether the oscillator 2 adjustment is of the type represented in Figure 4 or the type represented in Figure 5.

Assuming now that the local oscillator 2 is being cyclically tuned as illustrated in Figure 5, and the difference frequency is approaching 30 megacycles corresponding to the first point marked stable on the graph of Figure 5, just before it reaches that stable point, for example 28.5 megacycles, the voltage applied to grid 36 of tube 34 section (*a*) will be approximately 21 volts as indicated in the graph of Figure 3 that voltage is sufficient to cause the relay 30 to be de-energized and cause the balanced modulator to be controlled by the output of the cathode follower and thus the servomotor will be changed over from searching condition to null-seeking condition. Since under this condition (28.5 megacycles) the voltage on cathode 35 of cathode follower 22 is higher than the voltage on cathode 23 of the cathode follower, the 60 C. P. S. signal from the balanced modulator will cause the motor to turn until the oscillator 2 has been adjusted to produce a difference frequency of exactly 30 megacycles.

Assuming now that the oscillator 2 is being cyclically tuned and the difference frequency between the output of oscillator 2 and the output of oscillator 1 is approaching 30 megacycles, the voltage applied to the grid 36 will be approximately 20 volts which will not be sufficient to cause the lock-in circuit to be triggered. A little later in the tuning cycle the voltage applied to grid 36 will then be approximately 21 volts which will cause the relay 30 to be de-energized and thus put the balanced modulator under the control of the cathode follower for a null seeking operation, however, since the cathode 35 of the cathode follower has a higher voltage than the voltage on cathode 23, the signal produced by the balanced modulator would be of a phase which would cause the motor to adjust the oscillator in the wrong direction for a null seeking operation and in a very short time the voltage applied to grid 36 would be so low that the relay 30 will again be energized to cause the servomotor to adjust the oscillator 2 in a cyclical operation. It is, therefore, seen that the automatic frequency control system of this invention will lock in only on the stable points and will not lock in on the unstable points.

While I have indicated and described one system for carrying out my invention, it will be apparent to those skilled in the art that my invention is not restricted to that particular system and many modifications, omissions and additions may be made without departing from the spirit and scope of my invention.

What I claim is:

1. An automatic frequency control system comprising a source of oscillations having frequency adjusting means, said frequency adjusting means including an electric motor having a fixed phase winding and a reversible phase winding and cam means whereby the source of oscillations is cyclically adjusted when said motor continuously runs in a predetermined direction, means to mix the output of said source of oscillations with another signal to produce an intermediate frequency, frequency discriminator means to produce a first voltage when said intermediate frequency is outside a predetermined range of frequencies, a second voltage when said intermediate frequency is above a predetermined value and within said predetermined range and to produce a third voltage when said intermediate frequency is below said predetermined value and within said predetermined range, said second voltage and said third voltage varying in magnitude as a function of the frequency difference between said intermediate frequency and said predetermined value, a source of alternating current, means to energize said fixed phase winding of said motor by said source of alternating current and means to energize said reversible phase winding of said motor from said source of alternating current including a balanced modulator, said balanced modulator including an electron tube having the first section and a second section, each section including at least a cathode, an anode and a control grid, means to apply said second voltage to the control grid of said first section, a relay having an energizing circuit, a first set of contacts which are closed when said relay is de-energized and a second set of contacts which are closed when said relay is energized, circuit means including said first set of contacts for applying said third voltage to the control grid of said second section and circuit means including said second set of contacts to cause said control grid of said second section to have a voltage different than the control grid of said first section, said energizing circuit of said relay having means responsive to said first voltage to cause said relay to be energized and responsive to said third voltage to cause said relay to be de-energized.

2. An automatic frequency control system comprising an oscillator having frequency adjusting means, means to mix the output of said oscillator with another signal to produce an intermediate frequency, frequency discriminator means to produce a first voltage varying in magnitude as a function of the frequency difference between said intermediate frequency and a first predetermined frequency and a second voltage varying in magnitude as a function of the frequency difference between said intermediate frequency and a second predetermined frequency, said first and second voltages being equal and having a predetermined magnitude at the center frequency of a predetermined band of frequencies which includes said first predetermined frequency and said second predetermined frequency, balanced modulator means to produce a first alternating current having a predetermined phase relationship and varying in magnitude as a function of said first voltage and to produce a second alternating current having a different phase relationship than said first alternating current and varying in magnitude as a function of said second voltage when said second voltage is applied to said balanced modulator means, lock-in means to control the application of said second voltage to said balanced modulator means, said lock-in means comprising a circuit interrupter having an energizing circuit including a first electron tube having a control grid, circuit means for controlling the potential applied to said control grid, said circuit means comprising a second electron tube having a control grid, means to apply said second voltage to said control grid of said second electron tube, circuit means to apply a first biasing voltage to said control grid of said second electron tube when said second electron tube is not conducting, said first biasing voltage having a value sufficient to cause the tube to conduct when said second voltage exceeds said predetermined magnitude and additional circuit means including said first electron tube to apply a second biasing voltage to the control grid of said second electron tube while said second electron tube is conducting, said second biasing voltage having a magnitude sufficient to cause the tube to be made nonconducting when said second voltage is below said predetermined magnitude.

3. An automatic frequency control system for producing an intermediate frequency of a predetermined frequency comprising a source of oscillations having frequency adjusting means including an electric motor having a fixed phase winding and a reversible phase winding and cam means whereby the source of oscillations is cyclically adjusted when said motor continuously runs in a predetermined direction; means to mix the output of said source of oscillations with another signal to produce an intermediate frequency signal; a first frequency sensitive circuit having a center frequency which is below said predetermined frequency, a second frequency sensitive circuit having a center frequency which is above said predetermined frequency; means to apply said intermediate frequency signal to said first and said second frequency sensitive circuits; means to rectify the output of said first frequency sensitive circuit to thereby produce a first unidirectional potential signal which is maximum when said intermediate frequency has a frequency equal to said center frequency of said first frequency sensitive circuit; means to rectify the output of said second frequency sensitive circuit to thereby produce a second unidirectional potential signal which is maximum when said intermediate frequency signal has a frequency equal to said center frequency of said second frequency sensitive circuit, the constants of said first frequency sensitive circuit and said frequency sensitive circuit having such values as to cause said first unidirectional potential signal to be equal in magnitude to said second unidirectional potential signal when said intermediate frequency signal equals said predetermined frequency; a source of alternating current; means to energize said fixed phase winding of said motor by said source of alternating current; means including a balanced modulator to energize said reversible phase winding of said motor from said source of alternating current; said balanced modulator including a first electron discharge device and a second electron discharge device, each including at least an anode, a cathode and a control grid; means to apply said second unidirectional potential signal to said control grid of said first electron discharge device; a relay having an energizing circuit, a first set of contacts which are closed when said relay is de-energized and a second set of contacts which are closed when said relay is energized; circuit means including said first set of contacts for applying said first unidirectional potential signal to said control grid of said second electron discharge device; circuit means including said second set of contacts to cause said control grid of said second electron discharge device to have a voltage different in magnitude than said first unidirectional potential signal; said energizing circuit of said relay having means responsive to said second unidirectional potential signal to cause said relay to be de-energized.

4. An automatic frequency control system for producing an intermediate frequency of a predetermined frequency comprising a source of oscillations having frequency adjusting means including an electric motor having a fixed phase winding and a reversible phase winding and cam means whereby the source of oscillations is cyclically adjusted when said motor continuously runs in a predetermined direction; means to mix the output of said source of oscillations with another signal to produce an intermediate frequency signal; a first frequency sensitive circuit having a center frequency which is below said predetermined frequency, a second frequency sensitive circuit having a center frequency which is above said predetermined frequency; means to apply said intermediate frequency signal to said first and said second frequency sensitive circuits; means to rectify the output of said first frequency sensitive circuit to thereby produce a first unidirectional potential signal which is maximum when said intermediate frequency has a frequency equal to said center frequency of said first frequency sensitive circuit; means to rectify the output of said second frequency sensitive circuit to thereby produce a second unidirectional potential signal which is maximum when said intermediate frequency signal has a frequency equal to said center frequency of said second frequency sensitive circuit, the constants of said first frequency sensitive circuit and said second frequency sensitive circuit having such values as to cause said first unidirectional potential signal to be equal in magnitude to said second unidirectional potential signal when said intermediate frequency signal equals said predetermined frequency; a source of alternating current; means to energize said fixed phase winding of said motor by said source of alternating current; means including a balanced modulator to energize said reversible phase winding of said motor from said source of alternating current; said balanced modulator including a first electron discharge device and a second electron discharge device, each including at least an anode, a cathode and a control grid; means to apply said second unidirectional potential signal to said control grid of said first electron discharge device; means responsive to the magnitude of said first unidirectional potential signal to apply said first unidirectional potential to said control grid of said second electron discharge device when the magnitude of said first unidirectional potential signal exceeds a predetermined value and to cause said first unidirectional potential signal to remain applied to said control grid of said second electron discharge device until the magnitude of said first unidirectional potential signal falls below a magnitude which is less than said predetermined magnitude by a predetermined amount.

References Cited in the file of this patent

UNITED STATES PATENTS

| Number | Name | Date |
|---|---|---|
| 2,206,695 | Guanella | July 2, 1940 |
| 2,369,663 | Dennis et al. | Feb. 20, 1945 |
| 2,452,575 | Kenny | Nov. 2, 1948 |
| 2,562,943 | Pensyl | Aug. 7, 1951 |